(12) United States Patent
Kim

(10) Patent No.: US 11,672,178 B2
(45) Date of Patent: Jun. 6, 2023

(54) THERMOELECTRIC ELEMENT ASSEMBLY, METHOD FOR MANUFACTURING THE SAME, AND THERMOELECTRIC MODULE COMPRISING THE SAME

(71) Applicant: UNIVERSITY OF SEOUL INDUSTRY COOPERATION FOUNDATION, Seoul (KR)

(72) Inventor: Sang Ii Kim, Seoul (KR)

(73) Assignee: UNIVERSITY OF SEOUL INDUSTRY COOPERATION FOUNDATION, Seoul (KR)

(*) Notice: Subject to any disclaimer, the term of this patent is extended or adjusted under 35 U.S.C. 154(b) by 0 days.

(21) Appl. No.: 17/388,012

(22) Filed: Jul. 29, 2021

(65) Prior Publication Data

US 2022/0045257 A1    Feb. 10, 2022

(30) Foreign Application Priority Data

Aug. 4, 2020   (KR) ........................ 10-2020-0097487

(51) Int. Cl.
  *H01L 35/32*    (2006.01)
  *H01L 35/34*    (2006.01)
  *H01L 35/16*    (2006.01)

(52) U.S. Cl.
  CPC .............. *H01L 35/32* (2013.01); *H01L 35/16* (2013.01); *H01L 35/34* (2013.01)

(58) Field of Classification Search
  None
  See application file for complete search history.

(56) References Cited

U.S. PATENT DOCUMENTS

| 6,306,673 B1* | 10/2001 | Imanishi | ................. H01L 35/34 438/22 |
| 2015/0179912 A1* | 6/2015 | Maeshima | .............. H01L 35/32 136/211 |

FOREIGN PATENT DOCUMENTS

| JP | 2896497 | 5/1999 | |
| JP | 2006041192 | 2/2006 | |
| JP | 2017208478 | 11/2017 | |
| KR | 100461717 | 12/2004 | |
| KR | 1020170028172 | 3/2017 | |
| KR | 2020010784 A * | 1/2020 | ............. H01L 35/04 |
| KR | 1020200010784 | 1/2020 | |
| KR | 20200023101 A * | 3/2020 | ............. H01L 35/04 |
| KR | 10-2123319 B1 * | 6/2020 | ............. H01L 35/34 |
| KR | 102123319 | 6/2020 | |

OTHER PUBLICATIONS

English machine translation of Shin (KR-2020010784-A) provided by the EPO website, 2022, All Pages. (Year: 2022).*
English machine translation of Park (KR-20200023101-A) provided by the EPO website, 2022, All Pages. (Year: 2022).*
English machine translation of Kim et al. (KR-10-2123319-B1) provided by the EPO website, 2022, All Pages. (Year: 2022).*

* cited by examiner

*Primary Examiner* — Daniel P Malley, Jr.
(74) *Attorney, Agent, or Firm* — Cantor Colburn LLP

(57) ABSTRACT

Provided is a thermoelectric element assembly including a soft support including a plurality of through-holes, and a plurality of p-type thermoelectric elements and a plurality of n-type thermoelectric elements inserted into a plurality of through-holes of the support, wherein a thickness of the support is less than a length of the thermoelectric element.

2 Claims, 8 Drawing Sheets

[FIG. 1]
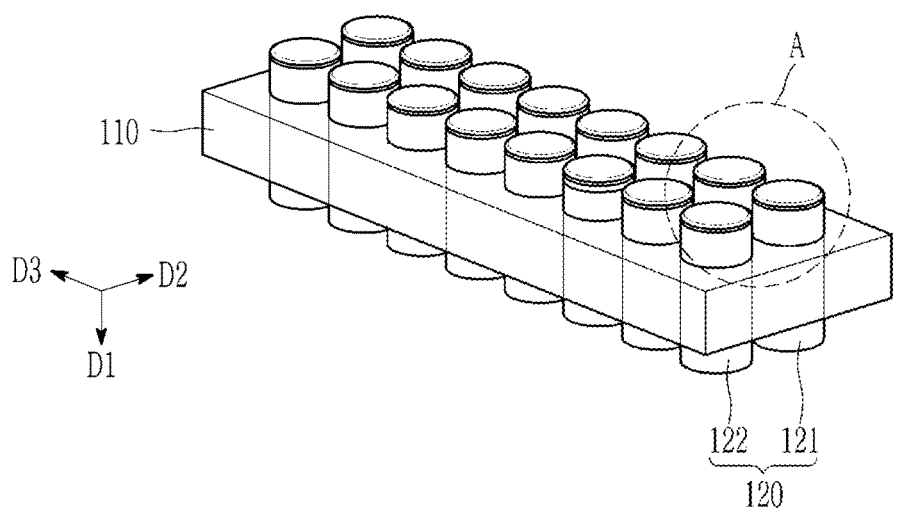
[FIG. 2]
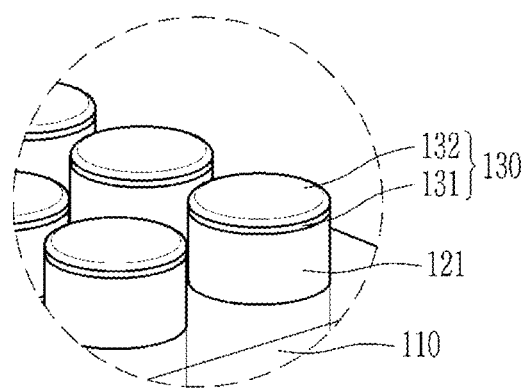

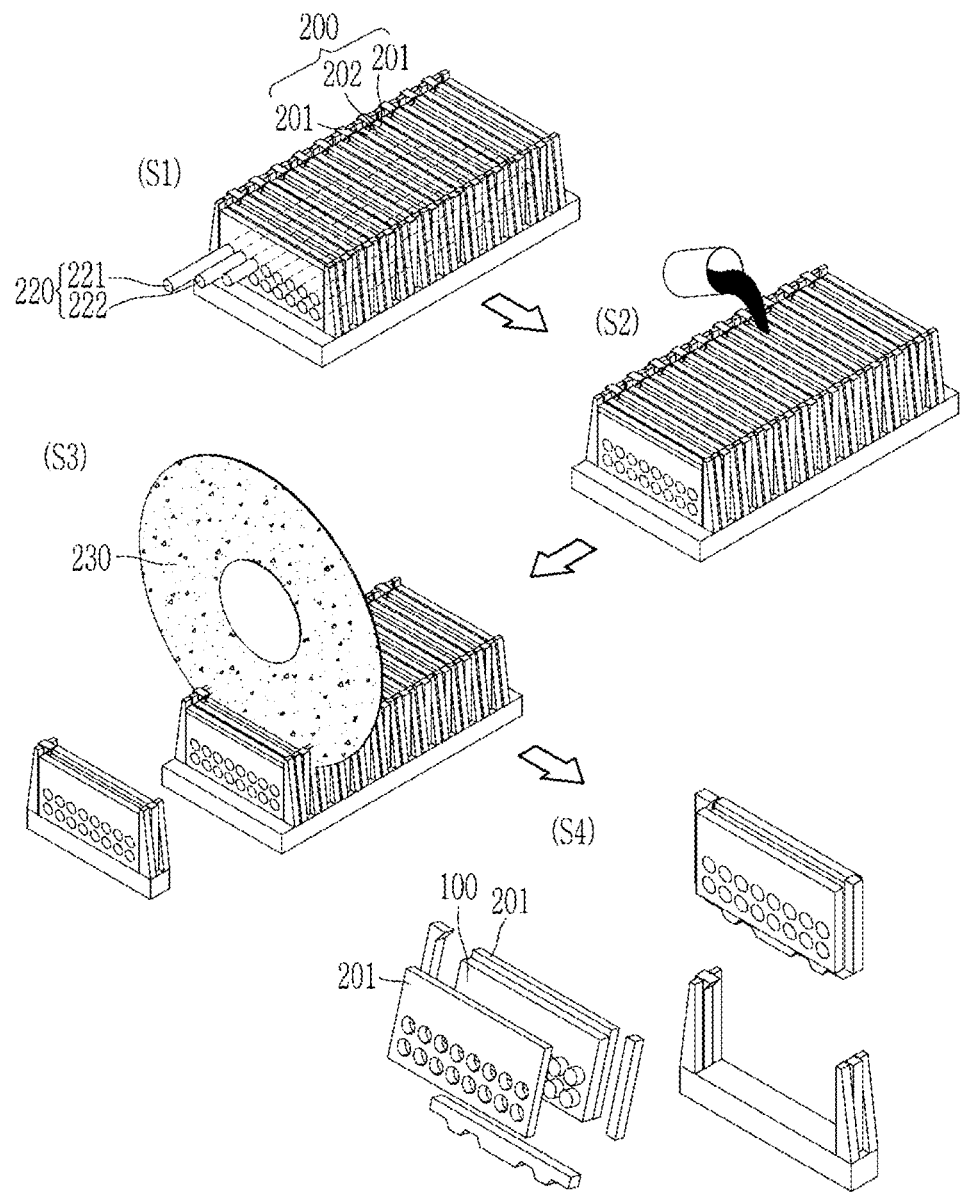
[FIG. 3]

【FIG. 4】
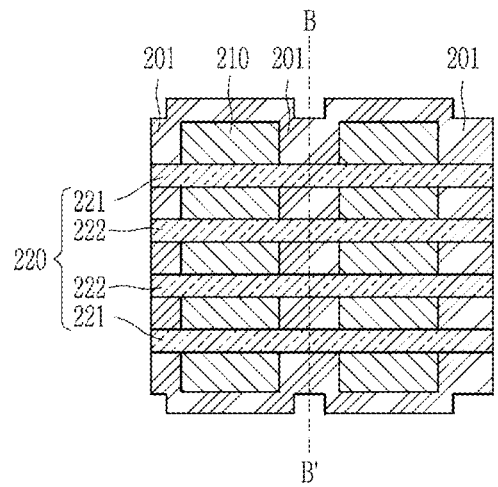
【FIG. 5】
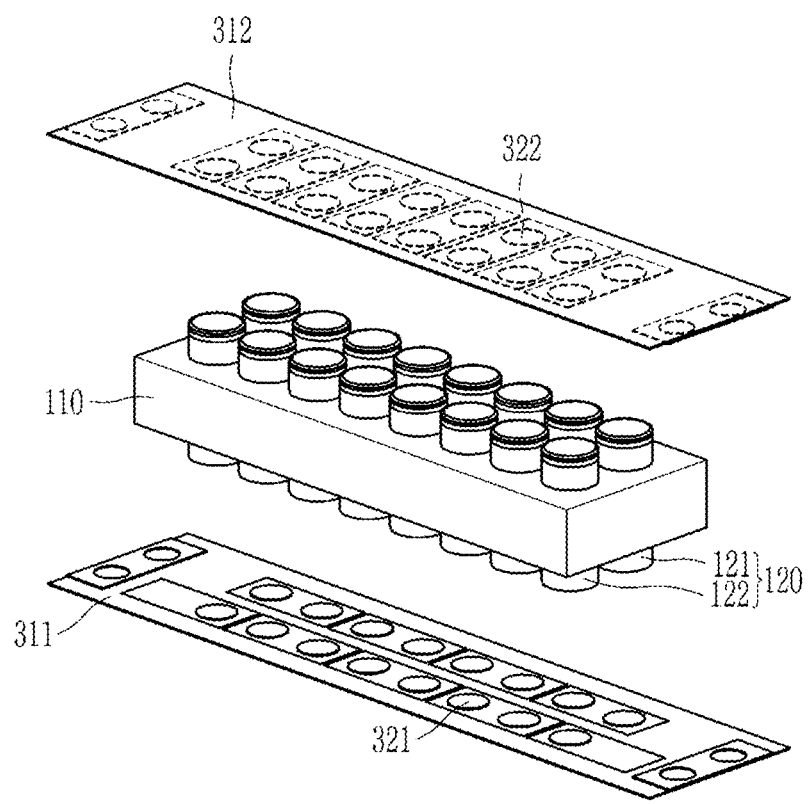

[FIG. 6]
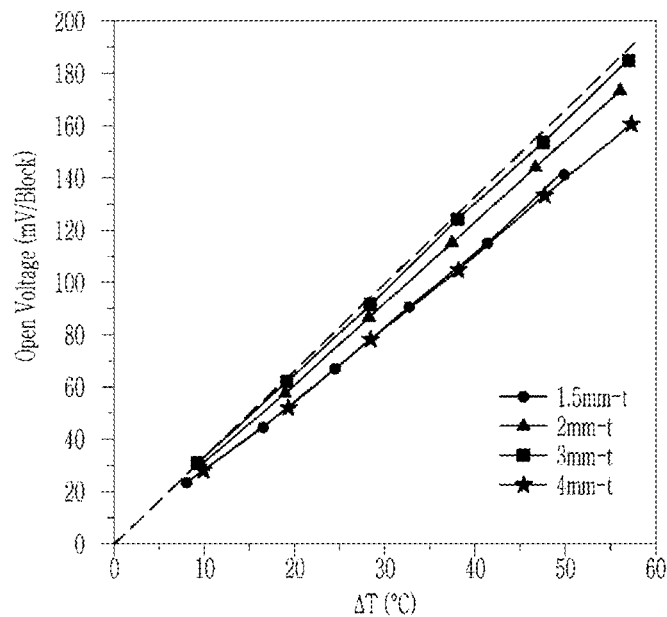
[FIG. 7]
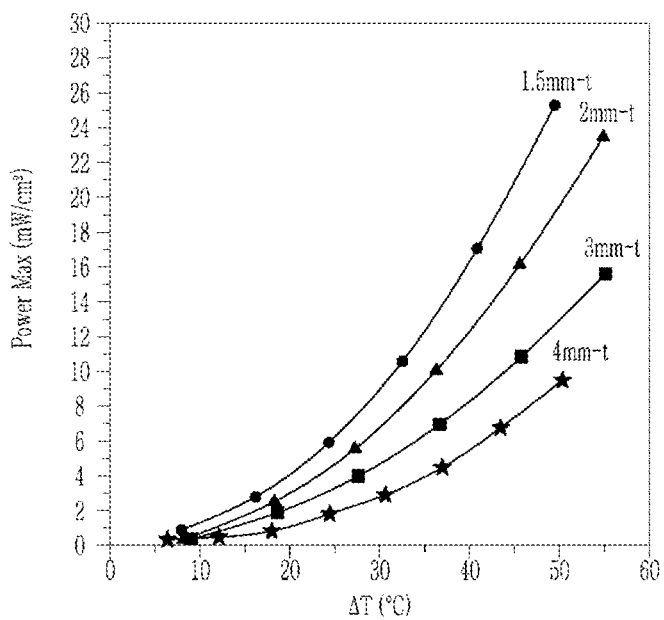

[FIG. 8]
[FIG. 9]
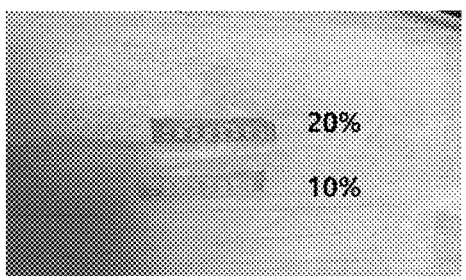
[FIG. 10]
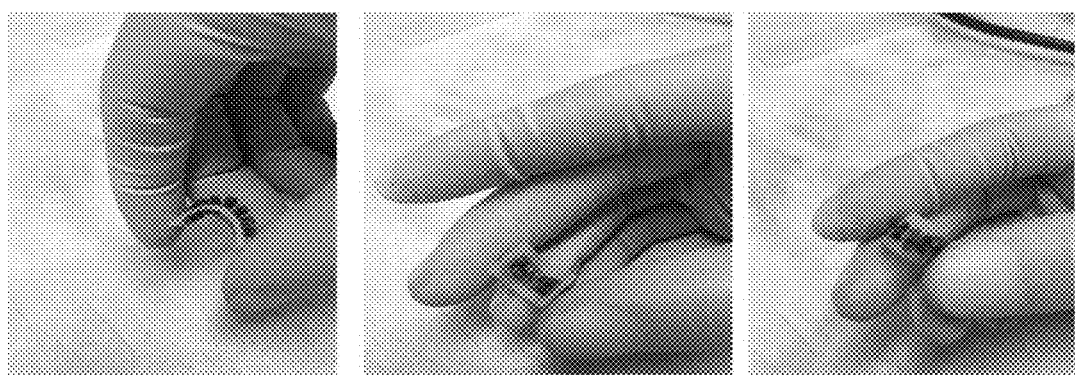

[FIG. 11]
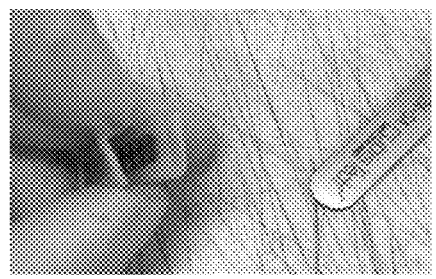
[FIG. 12]
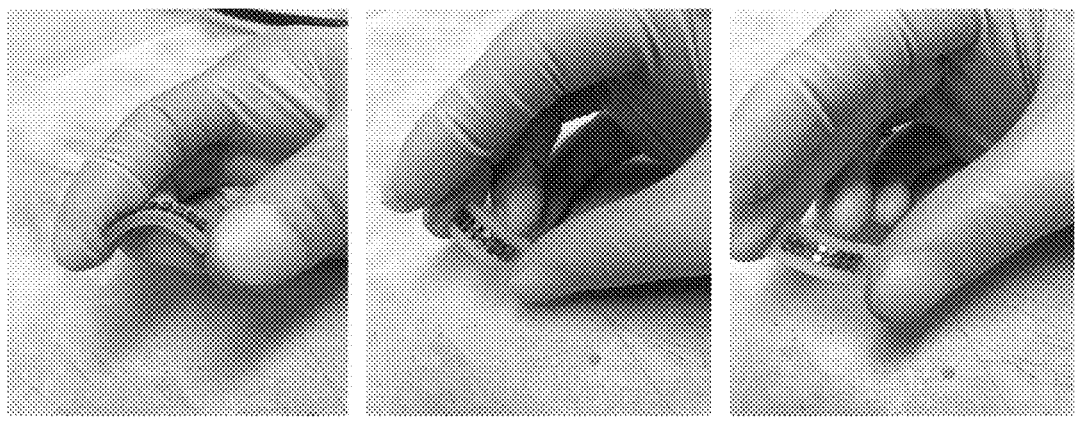

[FIG. 13]
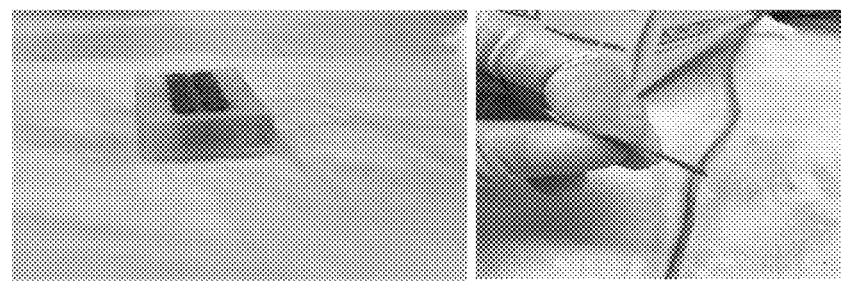
[FIG. 14]
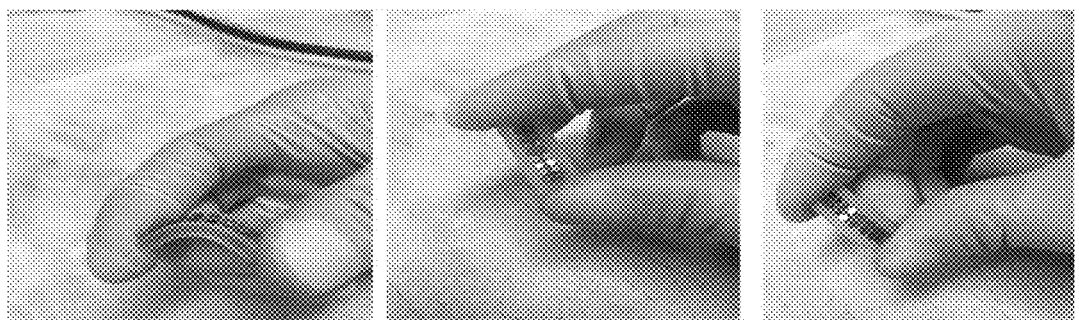

[FIG. 15]
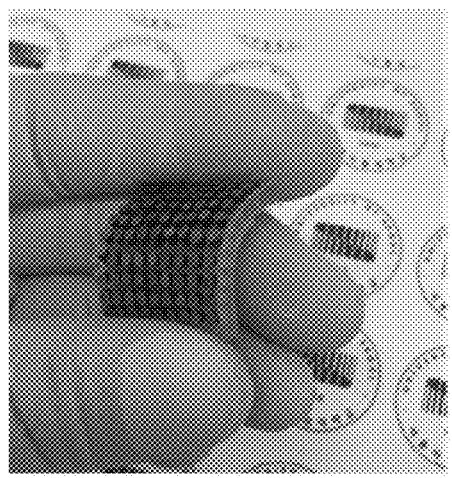
[FIG. 16]
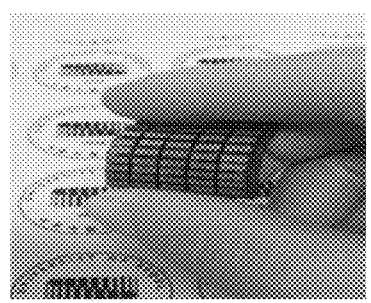

THERMOELECTRIC ELEMENT ASSEMBLY, METHOD FOR MANUFACTURING THE SAME, AND THERMOELECTRIC MODULE COMPRISING THE SAME

CROSS-REFERENCE TO RELATED APPLICATION

This application claims priority to and the benefit of Korean Patent Application No. 10-2020-0097487 filed in the Korean Intellectual Property Office on Aug. 4, 2020, the entire contents of which are incorporated herein by reference.

BACKGROUND OF THE INVENTION

(a) Field of the Invention

The present invention relates to a thermoelectric element assembly, a method of manufacturing the same, and a thermoelectric module including the same, and more particularly, to a thermoelectric element assembly capable of supplying power to a wearable device by attaching to a body and harvesting body heat, a method of manufacturing the same, and a thermoelectric module including the same.

(b) Description of the Related Art

A thermoelectric element typically is composed of three parts, that is, a heat source, a heat sink, and a thermopile. Herein, the thermopile is a plurality of thermopiles coupled in series and used to convert a portion of heat energy into electrical energy. In other words, the thermoelectric element generates electrical power based on a thermal gradient across thermocouples of the thermopiles.

The thermoelectric element accepts the heat energy through a "hot" side or junction, passes the heat energy through the thermopile, and releases it through a "cold" side or junction, converting the heat energy into the electrical power.

The thermoelectric element is formed by using semiconductor materials. The semiconductor materials are electrically connected in series and thermally coupled in parallel, forming two junctions, in order to form a thermocouple. The semiconductor materials are typically n-type and p-type, and in a typical thermoelectric device, p-type and n-type pellet materials form an electrically conductive connection and transfer carriers from the hot junction to the cold junction as a result of heat diffusion, inducing a current.

The thermoelectric element is widely used in the form of a module including a thermoelectric material for a special power supply using thermoelectric power generation, a precise temperature controller or a computer-related small cooler using thermoelectric cooling, an optical communication laser cooling system, a cooling system of hot and cold water machines, a semiconductor temperature control system, etc.

The thermoelectric module may be a bulk module formed by cutting and processing bulk-type thermoelectric elements and then assembling several mm-sized pieces obtained therefrom, a thin film module composed of a thermoelectric material having a thickness of about 10 μm or less, a thick film module formed of a thermoelectric material having a height of tens to about 500 μm, and the like.

On the other hand, a conventional thermoelectric module uses a rigid substrate and thus may not efficiently receive heat from a heat source with a curved or moving surface. In order to solve this problem, efforts to develop a flexible thermoelectric module are being made, but a thermoelectric module having a flexible structure without deteriorating thermoelectric efficiency is difficult to design, and is also difficult to mass-produce due to the complex-manufacturing process, so it is uneconomical.

PRIOR TECHNICAL LITERATURE

Patent Reference

U.S. Patent publication 2003-0084935 (Publication Date: 2003 May 8)

SUMMARY OF THE INVENTION

An embodiment provides a thermoelectric element assembly that may secure high thermoelectric efficiency and flexibility at the same time, may be produced by a simple process, and thus may be easily mass-produced.

Another embodiment provides a method of manufacturing a thermoelectric element assembly.

Another embodiment provides a thermoelectric module including a thermoelectric element assembly.

According to an embodiment, a thermoelectric element assembly includes a soft support including a plurality of through-holes, and a plurality of p-type thermoelectric elements and a plurality of n-type thermoelectric elements inserted into a plurality of through-holes of the support, wherein a thickness of the support is less than a length of the thermoelectric elements.

The thickness of the support may be about 30% to about 80% of the length of the thermoelectric elements.

The support may include polydimethylsiloxane (PDMS).

The upper and/or lower surfaces of the thermoelectric element may include a functional coating layer including a nickel-phosphorus (Ni—P) diffusion barrier layer, a tin (Sn) plating bonding functional layer, or both.

The side surface of the thermoelectric element may include an insulation polymer coating layer including urethane or epoxy.

According to another embodiment, a method of manufacturing a thermoelectric element assembly includes preparing a template including a plurality of empty spaces partitioned by a plurality of hard polymer partition walls and including a plurality of through-holes penetrating the plurality of hard polymer partition walls, inserting a plurality of n-type thermoelectric element extruded bodies and a plurality of p-type thermoelectric element extruded bodies into a plurality of through-holes of the template, injecting a liquid soft polymer into a plurality of empty spaces of the template and solidifying it to form a soft support, cutting each of the plurality of hard polymer partition walls to be horizontally divided in a plane direction, and removing the hard polymer on and/or under the soft support.

The method may further include forming a functional coating layer including a nickel-phosphorus (Ni—P) diffusion barrier layer, a tin (Sn) plating bonding functional layer, or both on the upper and/or lower surfaces of a plurality of n-type thermoelectric elements and a plurality of p-type thermoelectric elements exposed through the incision surfaces of a plurality of hard polymer partition walls.

According to another embodiment, a method of manufacturing a thermoelectric element assembly includes cutting the n-type thermoelectric element extruded body and the p-type thermoelectric element extruded body to manufacture a plurality of n-type thermoelectric elements and a plurality of p-type thermoelectric elements, forming a functional coating layer including a nickel-phosphorus (Ni—P) diffusion barrier layer, a tin (Sn) plating bonding functional layer, or both on the upper and/or lower surfaces of the plurality of n-type thermoelectric elements and the plurality of p-type thermoelectric elements, and inserting the plurality of n-type thermoelectric elements and the plurality of p-type thermoelectric elements into a plurality of through-holes of a soft support.

The functional coating layer may be formed using a barrel plating method.

According to another embodiment, a thermoelectric module includes a thermoelectric element assembly, and a plurality of n-type thermoelectric elements and an upper electrode and a lower electrode electrically connecting the plurality of n-type thermoelectric elements and the plurality of p-type thermoelectric elements in series.

The thermoelectric element assembly of the present disclosure may secure high thermoelectric efficiency and flexibility at the same time by supporting a thermoelectric element having high thermoelectric efficiency with a flexible support, and may be produced by a simple process, and thus mass production is easy and economic efficiency is improved.

As the thermoelectric element assembly has high thermoelectric efficiency and flexibility at the same time, it may be attached to a bent part of the body, and may supply power to the wearable device even at a low temperature difference by harvesting body heat.

BRIEF DESCRIPTION OF THE DRAWINGS

FIG. 1 is a schematic perspective view of a thermoelectric element assembly according to an embodiment.

FIG. 2 is an enlarged perspective view showing an enlarged portion A of FIG. 1.

FIG. 3 is a perspective view schematically illustrating a manufacturing process of a thermoelectric thermoelectric element assembly according to another embodiment.

FIG. 4 is a cross-sectional view schematically showing a cutting position in the cutting step (S3) of FIG. 3.

FIG. 5 is an exploded perspective view schematically illustrating a thermoelectric module according to another embodiment.

FIGS. 6 and 7 are graphs showing results of measuring an output voltage and an output power per unit area according to a temperature difference of a thermoelectric module in Experimental Example 1.

FIGS. 8 to 14 are photographs showing results of a bending test according to the thickness of a soft support in Experimental Example 2.

FIGS. 15 and 16 are photographs illustrating a thermoelectric element assembly and a thermoelectric module manufactured by scale-up.

DETAILED DESCRIPTION OF THE EMBODIMENTS

The advantages and features of the present disclosure and the methods for accomplishing the same will be apparent from the embodiments described hereinafter with reference to the accompanying drawings. However, the embodiments should not be construed as being limited to the embodiments set forth herein. Unless otherwise defined, all terms (including technical and scientific terms) used herein have the same meaning as commonly understood by one of ordinary skill in the art. In addition, terms defined in a commonly used dictionary are not interpreted ideally or excessively unless specifically and explicitly defined.

In addition, unless explicitly described to the contrary, the word "comprise", and variations such as "comprises" or "comprising", will be understood to imply the inclusion of stated elements but not the exclusion of any other elements.

A thermoelectric element assembly according to an embodiment includes a soft support including a plurality of through-holes, and a plurality of p-type thermoelectric elements and a plurality of n-type thermoelectric elements inserted into a plurality of through-holes of the soft support.

FIG. 1 is a perspective view schematically illustrating a thermoelectric element assembly, and FIG. 2 is an enlarged perspective view showing an enlarged portion A of FIG. 1. Hereinafter, a thermoelectric element assembly is described in detail with reference to FIGS. 1 and 2.

The support 110 includes a plurality of through-holes, and a plurality of p-type thermoelectric elements 122 and a plurality of n-type thermoelectric elements 121 are inserted into the plurality of through-holes of the support 110.

The thermoelectric elements 120 may be inserted into a plurality of through-holes of the support 110 in the length direction. Herein, the length direction means a direction having the longest length among the width, length, and height of the thermoelectric elements 120, and for example, when the thermoelectric elements 120 have a cylindrical shape as shown in FIGS. 1 and 2, it means an axial direction, and specifically, a D1 direction of FIG. 1.

A thickness of the support 110 may be smaller than the length of the thermoelectric elements 120. Herein, the thickness of the support 110 refers to a length in a direction that the thermoelectric elements 120 are inserted.

In a case that the thickness of the support 110 is equal to the length of the thermoelectric elements 120, when the support 110 is bent, a tensile stress outside the curve (curvature) becomes large in order to compensate for a compressive stress inside the curve and thus may not only deteriorate flexibility but also give a lot of stress to the thermoelectric elements 120 and electrodes and eventually break them. In addition, since the support 110 has about five times higher thermal conductivity (about 0.15 W/mK) than thermal conductivity (about 0.02 W/mK to about 0.03 W/mK) of air, when the support 110 is thick, the thermal conductivity may be increased.

Accordingly, the thickness of the support 110 may be made to be smaller than the length of the thermoelectric elements 120 to improve the flexibility and lower the thermal conductivity. In addition, a portion of the side surfaces of thermoelectric elements 120 may not be covered by the support 110 but may be exposed to the outside of the support 110, thereby preventing the thermoelectric elements 120 from being damaged by the stress.

For example, the thickness of the support 110 may be about 80% or less, for example, about 70% or less, about 60% or less, or about 50% or less, about 30% or more, for example, about 40% or more, about 50% or more, or about 30% to about 80%, for example, about 40% to about 70%, or about 50% to about 60%, relative to a length of the thermoelectric elements 120. The thickness (%) of the support 110 related to the length of the thermoelectric elements 120 may be calculated according to Equation 1.

$$\text{Thickness (\%) of a support related to length of thermoelectric elements} = \text{thickness (length) of the support/length of the thermoelectric elements} \times 100 \quad \text{[Equation 1]}$$

The support 110 may include, for example, a soft polymer. In addition, the support 110 is composed of a material having as low a thermal conductivity as possible to minimize heat loss inside the thermoelectric module and thus maximize thermoelectric efficiency. For example, polydimethylsiloxane (PDMS) has excellent flexibility and low thermal conductivity and thus is an appropriate material for the support 110. However, the material of the support 110 is not limited to the polydimethylsiloxane (PDMS), but may include other soft polymers having low thermal conductivity and flexibility.

The p-type thermoelectric element 122 and the n-type thermoelectric element 121 are provided in plural and inserted into a plurality of through-holes of the support 110 formed at predetermined intervals. For example, the n-type thermoelectric element 121 and the p-type thermoelectric element 122 may be alternately disposed.

When the p-type thermoelectric elements 122 and the n-type thermoelectric elements 121 are semiconductor materials and are electrically connected each other, carriers may be transferred from a hot junction to a cold junction as a result of heat diffusion and thus induce a current.

For example, the p-type thermoelectric elements 122 are p-type semiconductor devices and may include a main raw material consisting of bismuth telluride-based (BiTe-based) materials including antimony (Sb), nickel (Ni), aluminum (Al), copper (Cu), silver (Ag), lead (Pb), boron (B), gallium (Ga), tellurium (Te), bismuth (Bi), and indium (In) and a mixture of Bi or Te in an amount of about 0.001 wt % to about 1.0 wt % based on a total weight of the main raw material. Specifically, a Bi—Sb—Te material is used as the main raw material, and Bi or Te in an amount of about 0.001 wt % to about 1.0 wt % based on a total weight of the Bi—Sb—Te material may be added thereto. In other words, when about 100 g of the Bi—Sb—Te material is used, Bi or Te may be used within a range of about 0.001 g to about 1 g. When the material added to the aforementioned main raw material is used out of the range of about 0.001 wt % to about 0.1 wt %, thermal conductivity does not decrease, but electrical conductivity decreases, so that improvement of a ZT value cannot be expected. Specifically, the p-type thermoelectric element 122 may include bismuth-antimony-tellurium ($Bi_{2-x}Sb_xTe_3$).

For example, the n-type thermoelectric elements 121 are n-type semiconductor devices and may be formed by using a main raw material consisting of bismuth telluride-based (BiTe-based) materials such as selenium (Se), nickel (Ni), aluminum (Al), copper (Cu), silver (Ag), lead (Pb), boron (B), gallium (Ga), tellurium (Te), bismuth (Bi), and indium (In) and a mixture of Bi or Te in an amount of about 0.001 wt % to about 1.0 wt % based on a total weight of the main raw material. For example, a Bi—Se—Te material as the main raw material is used, and about 0.001 wt % to about 1.0 wt % of Bi or Te based on a total weight of Bi—Se—Te may be added thereto. In other words, when about 100 g of Bi—Se—Te is used, Bi or Te added thereto may be used within a range of about 0.001 g to about 1.0 g. As described above, when the added material to the main raw material is used out of a weight range of about 0.001 wt % to about 0.1 wt %, the thermal conductivity does not decrease, but the electric conductivity decreases, such that the improvement of the ZT value cannot be expected. Specifically, the n-type thermoelectric element 121 may include copper-bismuth-tellurium-selenium ($Cu_{0.008}Bi_2Te_{3-x}Se_x$).

The thermoelectric element 120 may have a rod shape (e.g., a column shape, a stick shape, a cylinder shape, etc.) and a polygonal cross-section shape such as a circle, an ellipse, a triangle, a quadrangle, a pentagon, and the like, but is not limited thereto. The thermoelectric element 120 may be manufactured by thermally extruding a p-type thermoelectric element material or an n-type thermoelectric element material into an extruded body and cutting it into an appropriate length.

The thermoelectric element 120 may be manufactured to have a diameter required by the thermoelectric module, and in consideration of efficient operation of the thermoelectric module, the diameter may be about 0.5 mm to about 7 mm. The length of the thermoelectric element 120 may be about 100 mm to about 500 mm, but when the length of the thermoelectric element 120 is shorter than about 100 mm, production efficiency may decrease, and when the length of the thermoelectric element 120 is longer than about 500 mm, the thermoelectric element 120 may be warped and thus cause a problem in a manufacturing process for the thermoelectric element assembly 100.

The thermoelectric element assembly 100 may include 2 to 300 of the p-type thermoelectric elements 122 and the n-type thermoelectric elements 121, respectively. A micro-module may be composed of two pairs of the p-type thermoelectric elements 122 and the n-type thermoelectric elements 121, and a generation module may be composed of about 300 pairs of the p-type thermoelectric elements 122 and the n-type thermoelectric elements 121 to increase a voltage. When there are about 300 pairs or more of the p-type thermoelectric elements 122 and the n-type thermoelectric elements 121, reliability of driving the thermoelectric module may be deteriorated.

On the other hand, the upper and/or lower surfaces of the thermoelectric element 120 may include a functional coating layer 130. The functional coating layer 130 includes a connection element designed to provide an electrical connection between the thermoelectric element 120 and the electrodes.

The functional coating layer 130 includes a diffusion barrier layer 131 of which a material is diffused between the thermoelectric element 120 and the electrodes during the operation of the thermoelectric module and that prevents deterioration of reliability and performance of the thermoelectric module and/or a bonding functional layer 132 improving junction characteristics in a process of bonding the thermoelectric element 120 and the electrodes.

The diffusion barrier layer 131 may include Ni, Ni—P, Au, Mo, etc., and the bonding functional layer 132 may include Sn, a Sn alloy, Au, etc., which may be coated, for example, by plating.

The functional coating layer 130 may have a thickness of about 5 μm to about 50 μm. When the functional coating layer 130 is thinner than about 5 μm, function characteristics thereof may be difficult to express, and when the functional coating layer 130 is thicker than about 50 μm, performance of the thermoelectric module may be deteriorated.

On the other hand, when the thickness of the support 110 is smaller than the length of the thermoelectric element 120 as aforementioned, a portion of a side surface of the thermoelectric element 120 is not wrapped by the support 110 but is exposed to the outside thereof, so that the thermoelectric element 120 may be exposed to air and oxidized by oxygen or moisture.

In order to solve this problem, the side surface of the thermoelectric element 120 may include an insulation polymer coating layer including urethane or epoxy (not shown). The insulation polymer coating layer may have a thickness of about 5 μm to about 50 μm. When the insulation polymer coating layer is thinner than about 5 μm, an insulation effect thereof may be insignificant, but when the insulation polymer coating layer is thicker than about 50 μm, performance of the thermoelectric module may be deteriorated.

Another embodiment of the present invention provides a manufacturing method of the thermoelectric element assembly, which includes preparing a template, inserting thermoelectric element extruded bodies into the template, injecting a liquid soft polymer into the template to form a soft support, cutting the template, and removing the template.

FIG. 3 is a perspective view schematically illustrating a manufacturing process of a thermoelectric element assembly. Hereinafter, a process of manufacturing a thermoelectric element assembly is described with reference to FIG. 3.

A template 200 includes a plurality of empty spaces 202 partitioned by a plurality of hard polymer partition walls 201 and a plurality of through-holes penetrating the plurality of hard polymer partition walls 201. The template 200 may be manufactured simply through a 3D printing method.

The hard polymer is harder than the soft polymer forming the support 110, and may include, for example, polydimethylsiloxane, polylactic acid (PLA), acrylonitrile-butadiene-styrene (ABS), or the like, but is not limited thereto.

For example, the template 200 may include a whole fixing frame, a lower fixing frame, a side fixing frame, and the hard polymer partition walls 201. The lower fixing frame, the side fixing frame, and the hard polymer partition walls 201 are assembled on the upper surface of the whole fixing frame to provide a plurality of empty spaces 202 where the liquid soft polymer 210 is cast, and the hard polymer partition walls 201 are aligned at intervals corresponding to a thickness of the support 110. In addition, in a portion of the side fixing frame, and the hard polymer partition walls 201 of the template 200, a plurality of through-holes into which thermoelectric element extruded bodies 220 are inserted may be formed.

First, into the plurality of through-holes of the template 200, a plurality of n-type thermoelectric element extruded bodies 221 and a plurality of p-type thermoelectric element extruded bodies 222 are inserted (S1).

The n-type thermoelectric element extruded bodies 221 and the p-type thermoelectric element extruded bodies 222 are manufactured by extruding each n-type thermoelectric element material and p-type thermoelectric element material at a high temperature, and then cutting into a predetermined length to prepare the n-type thermoelectric element 121 and the p-type thermoelectric element 122.

Optionally, on the side surfaces of the n-type thermoelectric element extruded bodies 221 and the p-type thermoelectric element extruded bodies 222, an insulation polymer coating layer including urethane or epoxy may be further formed. Through the insulation polymer coating layer, deterioration of the n-type thermoelectric element extruded bodies 221 and the p-type thermoelectric element extruded bodies 222 by moisture and oxygen during the air exposure is prevented, and after coating the insulation polymer coating layer in the n-type thermoelectric element extruded bodies 221 and the p-type thermoelectric element extruded bodies 222, the thermoelectric element extruded bodies 220 are cut to manufacture the thermoelectric element 120, making it possible to mass coat a plurality of thermoelectric elements 120 in a simple method.

Subsequently, after injecting the liquid soft polymer 210 into the plurality of empty spaces 202 of the template 200 and solidifying it to form the support 110 (S2), each of the hard polymer partition walls 201 is cut so as to be divided horizontally in a plane direction (S3).

FIG. 4 is a cross-sectional view schematically showing a cutting position in the cutting step (S3) of FIG. 3. Referring to FIG. 4, in the cutting step (S3), each of the hard polymer partition walls 201 is cut to be divided horizontally with the surface of the plane direction by using a cutter 230. When the plurality of hard polymer partition walls 201 are cut, since the thermoelectric element extruded bodies 220 are also cut, through this process, a plurality of thermoelectric element assemblies 100 may be mass-produced in a simple method.

In this way, through the cutting of the hard polymer partition walls 201, precise cutting may be achieved. When there are no hard polymer partition walls 201 in the template 200, the support 110 integrally formed of the soft polymer is difficult to precisely cut, and since the support 110 is cut with the thermoelectric element extruded bodies 220, the support 110 is impossible to adjust to have a smaller thickness than the length of the thermoelectric elements 120.

Optionally, the functional coating layer 130 may be formed on the upper and/or lower surface of the thermoelectric elements 120 exposed through the incision surfaces of the plurality of hard polymer partition walls 201 by using an electroless plating method and the like. Through this method, the functional coating layer 130 may be formed at once only on the upper and/or lower surfaces of the thermoelectric elements 120.

Subsequently, the hard polymer above and/or below the support 110 may be removed to obtain the thermoelectric element assembly 100 in which the thickness of the support 110 is smaller than the length of the thermoelectric elements 120 (S4).

A method of manufacturing a thermoelectric element assembly according to another embodiment includes cutting the n-type thermoelectric element extruded body and the p-type thermoelectric element extruded body to manufacture a plurality of n-type thermoelectric elements and a plurality of p-type thermoelectric elements, forming a functional coating layer on the upper and/or lower surfaces of the plurality of n-type thermoelectric elements and the plurality of p-type thermoelectric elements, and inserting the plurality of n-type thermoelectric elements and the plurality of p-type thermoelectric elements into a plurality of through-holes of a soft support.

In this method of manufacturing the thermoelectric element assembly 100, since the functional coating layer 130 is not formed in a state that the thermoelectric elements 120 are inserted into the support 110, the electroless plating method, which takes a long time and has low coating adhesion, need not be used, but the functional coating layer 130 may be formed, for example, by using a barrel plating method.

The barrel plating method is performed by putting the cut thermoelectric elements 120 and stainless steel balls in a container made of celluloid, bakelite, an acrylic resin, etc. and having a cathode as the central axis and a plurality of holes, and then reacting them in an electrolyte solution to make them contact the thermoelectric elements 120 and thus proceed with plating. This barrel plating method is used to improve plating bonding strength of the functional coating layer 130.

A thermoelectric module according to another embodiment includes a thermoelectric element assembly, and a plurality of n-type thermoelectric elements, and an upper electrode and a lower electrode electrically connecting the plurality of n-type thermoelectric elements and the plurality of p-type thermoelectric elements in series.

An upper electrode 322 and a lower electrode 321 are spaced apart from each other at a predetermined interval and connect a pair of each p-type thermoelectric element 122 and each n-type thermoelectric element 121, so that a plurality of the p-type thermoelectric elements 122 and the n-type thermoelectric elements 121 may be electrically connected in series by the upper electrode 322 and the lower electrode 321.

The upper electrode 322 and the lower electrode 321 may be respectively disposed on the upper substrate 312 and the lower substrate 311 and electrically connected to the p-type thermoelectric elements 122 and the n-type thermoelectric elements 121 by using an electrode material such as Cu, Ag, Ni, and the like, and accordingly, when a plurality of unit cells is connected each other, adjacent unit cells may form electrical connections.

The upper electrode 322 and the lower electrode 321 may have a thickness within a range of about 0.1 mm to about 1.0 mm depending on a current amount flowing in the thermoelectric module. When the upper electrode 322 and the lower electrode 321 have a thickness of about 0.1 mm or less, functions of the electrodes are deteriorated, decreasing electrical conductivity, but when the thickness is about 1.0 mm or more, conduction efficiency may decrease due to a resistance increase.

The upper electrode 322 and the lower electrode 321 may be patterned by CVD (chemical vapor deposition), plasma treatment, or screen coating treatment. In addition, the upper electrode 322 and the lower electrode 321 may be patterned by using a foil-shaped material.

For example, the upper electrode 322 and the lower electrode 321 may be respectively formed by mounting a metal mask or a metal mesh prepared in advance on one surface of the upper substrate 312 and the lower substrate 311, and then passing ball-milled metal powder such as silver or copper through the metal mask or the metal mesh. In other words, in the metal mask or the metal mesh, fine holes are formed where the electrodes are supposed to be formed, so that the metal powder such as silver or copper may pass through the holes, so that the electrodes may be screen-printed on one surface of a substrate.

Hereinafter, specific examples of the invention are presented. However, the examples described below are only intended to specifically illustrate or describe the invention, and this should not limit the scope of the invention.

Preparation Example 1: Manufacture of Thermoelectric Element Assembly

After placing n-type $Cu_{0.008}Bi_2Te_{2.7}Se_{0.3}$ (CBTS) and p-type $Bi_{0.5}Sb_{1.5}Te_3$ (BST) thermoelectric elements respectively having a diameter of 1.8 mm, which were manufactured through hot extrusion at a high temperature, on a template (PLA material) injected to have a shape shown in FIG. 3 by using 3D printing, Sylgard 184 silicone elastomer was mixed in a ratio of base:hardener=9:1 and cast on the template where the thermoelectric elements were placed. After being cured at 100° C. for 4 hours in an electric heating furnace, the template was cut to have a predetermined thickness, manufacturing a thermoelectric element assembly.

Herein, spaces between hard polymer partition walls of the template were controlled to adjust a thickness of a manufactured support.

Preparation Example 2: Formation of Functional Coating Layer

A sodium hydroxide (NaOH) aqueous solution was used to remove impurities and an organic material on the surface of the thermoelectric element assembly, and a nitric acid ($HNO_3$) aqueous solution was used for etching. Subsequently, a tin chloride ($SnCl_2$) aqueous solution and a palladium chloride ($PdCl_2$) aqueous solution were used to perform sensitization and activation as a pre-treatment. Then, nickel-phosphorus alloy electroless plating was performed to form an about 10 μm-thick nickel-phosphorus alloy coating layer on the surface of the thermoelectric element assembly by a reduction reaction of nickel and phosphorus in a sodium hypophosphite ($NaH_2PO_2$) bath.

Preparation Example 3: Electrode Bonding

An n-type $Cu_{0.008}Bi_2Te_{2.7}Se_{0.3}$ device and a p-type $Bi_{0.5}Sb_{1.5}Te_3$ device, which were alternately disposed, were soldered to a copper electrode.

Comparative Preparation Example 1: Manufacture of Thermoelectric Element Assembly A thermoelectric element assembly was manufactured according to the same method as Preparation Example 1, except that a template having an integrally-formed internal empty space without the internal hard polymer partition walls was used instead of the template injected into the shape shown in FIG. 3.

[Analysis Method]
(1) Output Voltage Measurement

An output voltage was measured in a given state of a predetermined temperature difference (ΔT) depending on temperature conditions of a cold side and a hot side, which were input into a thermoelectric module generation output and efficiency measurement system.

In the measurement of the output voltage, a graph of temperature difference vs. output voltage was obtained by measuring a voltage difference generated due to a Seebeck effect caused by a temperature difference applied to the n-type and p-type thermoelectric elements inside a thermoelectric module.

(2) Output Power Measurement

Output power of the thermoelectric module was obtained by simultaneously measuring the output voltage and electric power of the thermoelectric module at a current increasing at regular intervals, while the temperature difference was constantly maintained at the same time.

Experimental Example 1: Measurement Result of Output Voltage and Output Power

In Preparation Example 1, the thermoelectric element assembly was manufactured to be respectively 4 mm, 3 mm, 2 mm, and 1.5 mm thick, and the thermoelectric element assembly of Comparison Preparation Example 1 was manufactured to be 1.5 mm thick.

The thermoelectric modules manufactured in the preparation example were manufactured with respect to an output voltage depending on a temperature difference (ΔT) and output power per unit area, and the results are shown in Table 1 and FIGS. 6 and 7.

TABLE 1

| | Thickness (mm) | $P_{max}$ (mW/cm²) | | | |
|---|---|---|---|---|---|
| | | Δ T-10K | Δ T-20K | Δ T-30K | Δ T-50K |
| Preparation | 4 mm | 0.30 | 1.0 | 2.7 | 9.2 |
| Example 1 | 3 mm | 0.52 | 2.2 | 4.6 | 12.8 |

TABLE 1-continued

| Thickness | $P_{max}$ (mW/cm$^2$) | | | |
|---|---|---|---|---|
| (mm) | Δ T-10K | Δ T-20K | Δ T-30K | Δ T-50K |
| 2 mm | 0.73 | 3.1 | 6.7 | 19.2 |
| 1.5 mm | 1.1 | 4.1 | 8.9 | 25.1 |

Referring to Table 1 and FIGS. 6 and 7, an open voltage was obtained regardless of the thicknesses of the thermoelectric element assemblies, and as the thermoelectric element assemblies became thinner, a larger output per unit area was generated (the thickness and the output had an inversely proportional relationship). This means that the modules were successfully fabricated.

Experimental Example 2: Measurement of Flexibility According to Thickness of Support In Preparation Example 1, thermoelectric element assemblies were manufactured by adjusting a thickness of a support into respectively 80%, 60%, 20%, and 10% of a length of a thermoelectric element.

FIGS. 8 and 9 are photographs of a thermoelectric element assembly in which the thickness of the support was 10%, and FIG. 10 is a photograph showing a bending test of the thermoelectric element assembly in which the thickness of the support was 10%.

Referring to FIG. 8, when the thickness of the support was 10%, the support did not sufficiently hold the thermoelectric elements, and when a hard polymer (a sacrificial layer) was removed, the support was damaged, disturbing alignment of the thermoelectric elements.

Referring to FIG. 9, since a support material, PDMS, had viscosity, the thinner the support material was, the harder the hard polymer was to remove, and when the support material was removed, the support was damaged more.

Referring to FIG. 10, when bent, the support did not sufficiently hold the thermoelectric elements, disturbing the alignment of the thermoelectric elements and making the thermoelectric elements contact each other.

FIG. 11 is a photograph of a thermoelectric element assembly in which the thickness of the support was 60%, and FIG. 12 is a photograph of a bending test of a thermoelectric element assembly in which the thickness of the support was 60%.

Referring to FIGS. 11 and 12, when the thickness of the support was 60%, since the support sufficiently held the thermoelectric elements, the alignment of the thermoelectric elements was not disturbed during the removal of the hard polymer (sacrificial layer) or the bending.

FIG. 13 is a photograph of a thermoelectric element assembly in which the thickness of the support was 80%, and FIG. 14 is a photograph of a bending test of a thermoelectric element assembly in which the thickness of the support was 80%.

Referring to FIG. 13, since the hard polymer (sacrificial layer) was very thin, the thermoelectric element assembly was deformed during the ultrasonic wave cleaning. In other words, since a Ni—P electroless plating film was affected by the surface condition, the ultrasonic wave cleaning was essential to remove impurities and an organic material, and accordingly, when the hard polymer was thin, the deformation occurred during the ultrasonic wave cleaning, resulting in plating in unnecessary portions during the plating process.

Referring to FIG. 14, since the support was thick, the support held the thermoelectric elements well and prevented the problem of disturbing the alignment of the thermoelectric elements, but only when the stress was applied more than before, the thermoelectric element assembly was bent to a certain level, and the stress was more concentrated in the middle and might damage the thermoelectric element assembly.

On the other hand, a thermoelectric element assembly was manufactured according to the same method as Preparation Examples 1 to 3 but scaled up to include 45 thermoelectric elements and have an area of 25×21 mm$^2$. A photograph of the thermoelectric element assembly is shown in FIG. 15, and a photograph of the thermoelectric module is shown in FIG. 16. Referring to FIGS. 15 and 16, the thermoelectric element assembly of the present invention might be scaled up.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

100: thermoelectric element assembly
110: soft support
120: thermoelectric element
121: n-type thermoelectric element
122: p-type thermoelectric element
130: functional coating layer
131: diffusion barrier layer
132: bonding functional layer
200: template
201: hard polymer partition wall
202: empty space
210: liquid soft polymer
220: thermoelectric element extruded body
221: n-type thermoelectric element extruded body
222: p-type thermoelectric element extruded body
230: cutter
311: lower substrate
312: upper substrate
321: lower electrode
322: upper electrode

What is claimed is:
1. A method of manufacturing a thermoelectric element assembly, comprising
preparing a template including a plurality of empty spaces partitioned by a plurality of hard polymer partition walls and including a plurality of through-holes penetrating the plurality of hard polymer partition walls,
inserting a plurality of n-type thermoelectric element extruded bodies and a plurality of p-type thermoelectric element extruded bodies into the plurality of through-holes penetrating the plurality of hard polymer partition walls of the template,
injecting a liquid soft polymer into the plurality of empty spaces of the template and solidifying it to form a soft support,
cutting each of the plurality of hard polymer partition walls to be horizontally divided in a plane direction, and
removing the cut hard polymer partition walls,
wherein a hard polymer of the hard polymer partition wall is harder than a soft polymer of the liquid soft polymer, wherein the plane direction of the hard polymer partition walls is perpendicular to a direction in which the plurality of n-type thermoelectric element extruded bodies and the plurality of p-type thermoelectric element extruded bodies are inserted, wherein the plurality of n-type thermoelectric element extruded bodies and the plurality of p-type thermoelectric element extruded bodies are cut when cutting each of the plurality of hard polymer partition walls to be horizontally divided in the plane direction, and wherein a thickness of the soft support is about 50% to about 60% of a length of cut n-type thermoelectric element extruded bodies and cut p-type thermoelectric element extruded bodies.

2. The method of claim 1, wherein the method further comprises forming a functional coating layer including a nickel-phosphorus (Ni—P) diffusion barrier layer, a tin (Sn) plating bonding functional layer, or both on the upper and/or lower surfaces of the cut n-type thermoelectric element extruded bodies and the cut p-type thermoelectric element extruded bodies before removing the cut hard polymer partition walls.

* * * * *